(12) United States Patent
Hurditch et al.

(10) Patent No.: US 6,303,260 B1
(45) Date of Patent: Oct. 16, 2001

(54) DISSOLUTION RATE MODIFIERS FOR LIFT-OFF RESISTS

(75) Inventors: Rodney J. Hurditch, Providence, RI (US); Donald W. Johnson, Brookline; Neela Joshi, Acton, both of MA (US)

(73) Assignee: MicroChem Corp., Newton, MA (US)

( * ) Notice: Subject to any disclaimer, the term of this patent is extended or adjusted under 35 U.S.C. 154(b) by 0 days.

(21) Appl. No.: 09/540,778

(22) Filed: Mar. 31, 2000

(51) Int. Cl.$^7$ ................................................. G03F 7/023
(52) U.S. Cl. ..................... 430/166; 430/329; 430/519
(58) Field of Search .................... 430/166, 519, 430/329

(56) References Cited

U.S. PATENT DOCUMENTS

| | | |
|---|---|---|
| 2,146,209 | 2/1939 | Graves et al. . |
| 3,284,425 | 11/1966 | Schröder et al. . |
| 4,246,374 | 1/1981 | Kopchik ........................ 525/329 |
| 4,524,121 | 6/1985 | Gleim et al. .................... 430/176 |
| 4,636,532 | 1/1987 | Sandford ........................... 522/3 |
| 4,689,243 | 8/1987 | Sasaki et al. ................... 427/54.1 |
| 4,814,258 | 3/1989 | Tam ................................ 430/315 |
| 5,532,109 | * 7/1996 | Krounbui et al. .............. 430/271.1 |
| 5,604,073 | 2/1997 | Krounbi et al. .................. 430/14 |
| 6,251,562 | * 6/2001 | Breyta et al. .................. 430/287.1 |

FOREIGN PATENT DOCUMENTS

| | | | |
|---|---|---|---|
| 1077872 | 3/1960 | (DE) | C08F/25/01 |
| 0 275918 | 7/1988 | (EP) | C08F/8/30 |
| 0 341843 | 11/1989 | (EP) | G03F/7/02 |

\* cited by examiner

*Primary Examiner*—John S. Chu
(74) *Attorney, Agent, or Firm*—William A. Simons; Wiggin & Dana

(57) ABSTRACT

Compositions useful for a lift-off resist in a bilayer metal lift-off process, which comprise a mixture of at least one solvent, at least one polyglutarimide resin and an effective amount of at least one actinic-absorbing dissolution rate modifier having the formulae of (IA) or (IB):

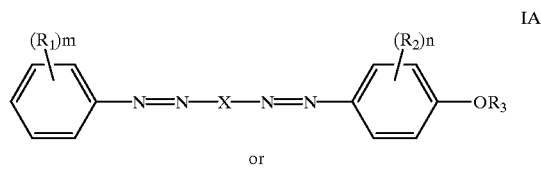

or

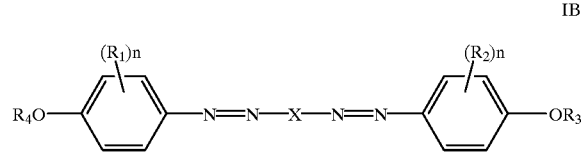

in which each $R_1$ and $R_2$ is selected from the group consisting of hydrogen, unsubstituted or substituted alkyl, alkoxy, nitro, halo, amide or hydroxy or a combination thereof, X is an aromatic group and $R_3$ and $R_4$ are selected from the group consisting of hydrogen, an unsubstituted or substituted alkyl or arylsulfonyl; each m is an integer from 1 to 5 and each n is an integer from 1 to 4.

18 Claims, No Drawings

DISSOLUTION RATE MODIFIERS FOR LIFT-OFF RESISTS

BACKGROUND OF THE INVENTION

1. Field of the Invention

The present invention relates to selected compositions useful as a lift-off photoresist in a bilayer metal lift-off process. In particular, this invention relates to specific compositions useful for that purpose that include at least one solvent, at least one polyglutarimide resin and at least one selected actinic-absorbing dye useful as dissolution rate modifier.

2. Brief Description of Art

The additive process of depositing patterned metal films onto microelectronic substrates is known as the lift-off process or metal lift-off process. There are several variations of this lift-off process. The most widely used lift-off processes involve a bilayer lithographic process (sometimes also referred to as a "bilevel" process). Such bilayer lift-off processes have been used to deposit the metallic "read-stripe" in the manufacture of thin film heads for magnetic hard drives and in the fabrication of the gate oxide for GaAs Field Effect Transistor (FET) devices. Variants of these bilayer lift-off processes are described in detail in European Patent Application No. 0341843 (assigned to International Business Machines Corp.) and U.S. Pat. No. 4,814,258 (assigned to Motorola Inc.).

In bilayer lift-off processes, a solution of a non-imaging lift-off resist (LOR) is first deposited by spin-coating to form a uniform thin film on top of a substrate to be metallized. The LOR layer is then soft-baked by heating at a sufficiently high temperature to remove most of the solvent contained in it. A conventional positive-imaging resist layer is then deposited on top of the LOR. The top resist and the lower LOR layer should not be intermixed. Therefore, the LOR should have a low solubility in conventional positive resist solvents.

After a second soft-bake to remove most of the residual solvent in the top resist layer, a pattern is transferred from a mask to the top resist film using a conventional microlithographic imaging tool such as a contact-proximity printer or stepper. The exposed areas in the top resist layer represent the areas to be metallized. The exposed resist is developed with an aqueous developer through to the LOR layer, which then dissolves both vertically through to the substrate and laterally to penetrate a small predefined distance into the adjacent unexposed areas of the photoresist layer. This lateral dissolution produces a controlled degree of undercut in a development time which is neither too long to make the process impractical or to remove too much unexposed photoresist, or too short to make the process irreproducible. In one variation of the process, often referred to as the PCM (portable conformable mask) variation, the underlying LOR is photosensitive in the deep ultra-violet (DUV) spectral range and the positive-imaging top resist is of the novolak-diazo-naphthoquinone type. The latter absorbs in the DUV and acts as a mask to an intermediate DUV flood exposure. This renders the lower LOR layer more soluble in a selected developer in the exposed areas that are to be removed during the development process. It is preferred to avoid a DUV intermediate exposure step and rely instead on the LOR having the desired rate of dissolution in the positive imaging resist developer. Moreover, this PCM process cannot be used with a positive top resist of the chemically amplified type designed to be photosensitive to DUV wavelengths.

After the desired degree of undercut is developed in the LOR layer, the metal layer is blanket-deposited by sputtering. The undercut ensures a discontinuity between the metal on top of the resist and the metal in the trench formed by the lithographic process. By this means, upon subsequent stripping of the remaining top photoresist and the LOR, the metal deposited on top of the resist is cleanly separated from the metal deposited on the substrate, ensuring consistent profiles and critical dimensions of the metal pattern. The degree of undercut, and hence the lateral dissolution rate, must be carefully controlled.

Partially or fully imidized acrylic polymers referred to as polyglutarimides, especially polydimethylglutarimide (PMGI), have been described in U.S. Pat. No. 4,524,121 (assigned to Rohm and Haas Co.). Polyglutarimide refers to a class of polymers containing partially cyclized imide and N-alkyl imide moeties and uncyclized polymethacrylate, in which the degree of cyclization as well as the ratio of N-alkyl to N–H can vary widely depending on the starting materials and the process used in the preparation. In the case where the alkyl group is methyl, the polymer is more correctly referred to as polydimethylglutarimide, or PMGI. If PMGI is made from polymethacrylic acid or a PMMA/methacrylic acid copolymer, (uncyclized) poly(methacrylicacid) units may also be present. PMGI polymers for lift-off applications are generally found to comprise about 65%–80% or more of cyclized imide moieties of which about 50–60% are N–H and the remainder N-methyl substituted. These compounds have several desirable properties, especially good solubility in aqueous bases typically used for the development of conventional positive resists, and poor solubility in positive resist solvents such as ethyl lactate, 2-heptanone and propylene glycol methyl ether acetate, which make them suitable for use in lift-off resists for bilayer lift-off process applications. Additionally, their solubility may be increased by exposure to high energy radiation such as deep ultra-violet (DUV) or electron beam.

The basic reaction to form poly(N-alkylimides) from the reaction of poly(methylmethacrylate)(PMMA) or poly(methacrylic acid) with an amine is disclosed in Graves U.S. Pat. No. 2,146,209, (assigned to E. I. du Pont de Nemours & Co.), see German Patent No. 1,077,872 and *Makromol. Chem.* 96, 227 (1966).

European Patent Application No. A0275918 (assigned to Verdril S.p.A.) discloses a solution process for making imidized acrylic polymers by reaction of acrylic resin with an amide U.S. Pat. No. 4,689,243 (assigned to Mitsubishi Rayon Co.) discloses a process for forming polyglutarimide polymers by reaction of a solution of PMMA with ammonia or an amine, followed by separation of the polymer from non-polymeric reaction products and solvents under vacuum in a vent extruder. As described in U.S. Pat. No. 3,284,425, the same reaction is carried out in a suspending solvent in an autoclave.

In any practical lift-off process, it is desirable to adjust and maintain precise control of the dissolution rate of the lift-off resist layer, so that the required degree of undercut is always obtained in a relatively short time using a developer which is compatible with, and provides a wide process latitude for the imaging positive photoresist layer.

Commercially available PMGI has been manufactured by the process described in U.S. Pat. No. 4,246,374 (assigned to Rohm and Haas). In this process, poly(methyl methacrylate) (PMMA) is imidized with ammonia gas in an extruder at high pressure and relatively high temperature. This reaction is practical only if the weight-average molecular weight ($M_w$) of the starting PMMA is sufficiently high (i.e. greater than 60,000 and typically 60,000 to 120,000). The resulting polymer should also contain about 20–35% of unreacted methacrylate moieties and about 30–60% of the nitrogen atoms on the imide groups should be methylated. The percentage of the remaining imide groups (N–H) determines the alkaline solubility. PMGI resins produced by this process have a fairly narrow range of alkaline solubility. This limitation creates the need for other methods of modifying the dissolution rate of these PMGI resins.

One such method is to reduce the molecular weight of PMGI by exposing the polymer to DUV radiation. This method has been described in U.S. Pat. No. 4,636,532 (assigned to Shipley Co.) By this means, the dissolution rate of PMGI, and hence the rate of undercut, can be increased to some extent. However, the amount of increase in the dissolution rate may be insufficient for certain lift-off processes requiring a relatively large rate of undercut to be useful with certain developers.

Additionally, the dissolution rate and hence the degree of undercut can also be adjusted somewhat by changing the conditions under which the spin-coated LOR film is soft-baked, especially the bake temperature. This arises because the dissolution rate of solvent-cast PMGI, like other polymers, is strongly dependent upon the concentration of solvent retained in the cast film. However, controlling the dissolution rate by this means is somewhat limited in practice, since other process requirements generally restrict the bake temperature range. For example, in the lift-off process commonly used in the manufacture of thin film heads, the maximum soft-bake temperature is generally about 160–170° C. in order to minimize adverse effects on the magnetic properties. Moreover, the rate of decrease of the dissolution rate of a PMGI LOR with temperature tends to become small above about 190° C., when most of the casting solvent has been removed. For all lift off processes, the recommended minimum bake temperature to produce good reproducibility in a PMGI LOR is about 150° C. Below 150° C., the dissolution rate tends to change very rapidly as a function of the bake temperature, exposure energy, time of development and other process parameters, which results in a narrow process window.

A further method of controlling the dissolution rate has been to change the conditions of the development process, such as varying the type or normality of the developer or the development time. When an advanced-type commercial positive resist is used for the top layer, it is desirable to use a developer which is optimally selected to provide the widest process window when used in conjunction with that photoresist. Such a developer may be of a type or normality which is less suited to achieve the desired rate of undercut in the LOR layer. This may lead to a development time that is too long or too short, or a soft-bake temperature that is too high or too low for optimum undercut. Thus, there is a need for other methods of controlling dissolution rates besides varying the type and normality of developer.

As the size of the features in the metal patterning process decreases, which is the trend in FET device and thin film head technologies, the degree of undercut required for the same development time also decreases, and hence there is a need to reduce rather than increase the PMGI dissolution rate after baking.

It has been determined that the use of lower dissolution rate, high molecular weight PMGI as the resin in an LOR lift-off processes can result in the formation of residue frequently referred to as scum, which retards the lateral dissolution and may give rise to defects in the final device.

The propensity for the formation of scum is greater at lower rates of dissolution, especially if the undercut rate is about 0.3 microns per minute or slower, which may be the case if the width of the metal feature of the lift-off process is less than about one micron. The propensity for the formation of scum diminishes if a low molecular-weight PMGI resin is used; however, such a resin has a relatively high dissolution rate compared with that ideally required for sub-micron processes requiring low rates of undercut.

Additionally, the positive photoresist selected for imaging a fine pattern is usually of an advanced type typically used in the fabrication of sub-micron semiconductor devices. These positive photoresists have been optimized for use with a specific normality of tetramethyl ammonium hydroxide (TMAH) developer (e.g. 2.38% by weight of TMAH in deionized water with or without an added surfactant). However PMGI resins, especially those having a low molecular weight, and, therefore, having a low propensity to scum, even after soft-baking at 200° C., tend to dissolve too rapidly in 2.38% TMAH developer so that it is difficult to obtain the desirable low undercut rate.

There is, therefore, a need to modify the dissolution rate of a lift-off resist, in a manner which results in precise control of the undercut rate, does not produce undesirable scum, permits the choice of a developer composition which is most compatible with the imaging photoresist, and maintains a wide process window for the lift-off process, especially when the degree of undercut required is to be relatively small. The present invention is a solution to this need.

Furthermore, the need for smaller geometries has recently led to a wide interest in the use of reduction steppers as the exposure tools, which combine high resolution imaging, a high throughput, and mask features which are 4 or 5 times larger in dimensions than those to be reproduced, therefore, making it easier to produce the masks. High resolution steppers normally use as the exposing radiation, selected narrow-band wavelengths of light filtered from the output of a mercury arc or mercury-xenon arc lamp. The shorter are the selected wavelengths, the higher is the resolution. Of particular interest for fine geometries such as 0.7 microns and smaller, is the use of an exposure wavelength centered at the mercury i-line at 365 nm. Of further interest for geometries below 0.3–0.35 um is an exposure source using an eximer laser at a wavelength of 248 nm.

It is widely known that a light-wave propagating through one or more thin film layers of transparent or semitransparent materials to a reflecting substrate can interfere with the reflected wave to produce standing waves. The amplitude of these standing waves depends on the reflectivity, the wavelength and the thickness of the films. Standing waves result in a changing exposure of the resist film, which depends critically on the thickness of the resist layer, the LOR layer, and the underlying substrate topography, all of which vary in practice, thus reducing the process latitude. The amplitude of standing waves is high when the wavelength is relatively short and the substrate reflectivity is relatively high, as is the case for most metals, silicon and GaAs. It is, therefore, desirable to increase the absorption of the LOR, such that a thin film will reduce the intensity of the reflected light and hence suppress the standing waves.

The reduction of the amplitude of standing waves by the use of dyes as additives in a conventional imaging photoresist, or in an antireflective coating as an intermediate layer between a photoresist and a reflective substrate, is well-known in the field of micro-lithography. Dyes which are suitable for use in antireflective coatings or as additives to photoresists, especially positive resists may not, however be suitable for use in a bilevel lift-off application because of the different requirements. In particular, it is especially difficult to select a dye which can be added to an LOR at a concentration high enough to provide sufficient absorbance in a thin film of the LOR at a specific actinic wavelength, yet capable of dissolving in a developer which is compatible with the imaging resist, at a rate commensurate with that required for the controlled degree of undercut, and will not form insoluble residues in the undercut regions. The dye must also be non-subliming or non-volatalizing, at temperatures significantly higher than those used to soft-bake positive resists, miscible with a polyglutarimide type polymer, and non-diffusing or non-leaching into a positive photoresist used as the top imaging layer in the lift-off process.

The addition of an actinic wavelength absorbing dye to a PMGI resin is disclosed in U.S. Pat. No. 5,604,073 assigned to International Business Machines Corp. The dye described in that IBM patent is a mono-azo dye, and is used as an adhesion promoter. It has a specific structure which acts as chelating ligand to the surface of a metal with which it may bind. The undercut rates of the disclosed compositions containing the dye are controlled by changing the development time or bake temperature.

BRIEF SUMMARY OF THE INVENTION

Therefore, one aspect of the present invention is directed to compositions useful for a lift-off resist in a bilayer metal lift-off process, which comprise a mixture of a solvent, at least one polyglutarimide resin and an effective amount of at least one actinic-absorbing dissolution rate modifier having the formulae (IA) or (IB):

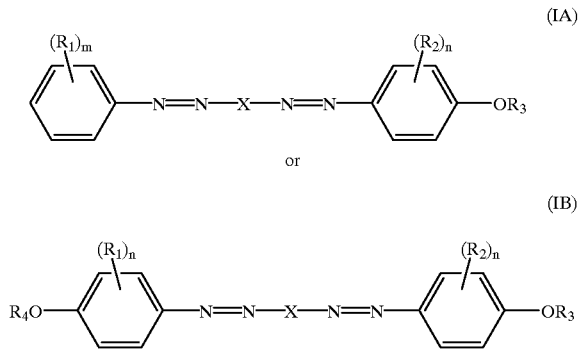

in which each $R_1$ and $R_2$ is selected from hydrogen, unsubstituted or substituted alkyl, alkoxy, nitro, halo, amide or hydroxy or a combinations thereof, X is an aromatic group and $R_3$ and $R_4$ are hydrogen, or an unsubstituted or a substituted alkyl or arylsulfonyl; each m is an integer from 1 to 5 and each n is an integer from 1 to 4.

Another aspect of the present invention is directed to composite articles which comprise (1) a microelectronic substrate; (2) a layer of lift-off resist as described above lying on top of the substrate; and (3) a layer of positive-imaging photoresist lying on top of the layer of lift-off resist.

It is an advantage of the present invention to provide issolution rate modifiers which impart high actinic absorbance to an LOR film and are soluble in solvents suitable for dissolving polyglutarimide resins such as PMGI, are miscible with polyglutarimide over a wide composition range, do not impair the film-forming characteristics of the lift-off resist, have melting points which are sufficiently high, are non-subliming and do not decompose or volatilize upon heating at the maximum temperature used in the application. Another advantage of the present invention is that these dissolution modifiers may be combined with a polyglutarimide resin to produce a LOR that does not form scum.

Other specific advantages of the present invention include providing a lift-off resist composition having both a high absorbance to actinic radiation and a wide range of dissolution rates, which are obtained without having to vary the soft-bake temperature, bake time or development time. Another advantage is the compatibility of these lift-off resist compositions with metal-ion-containing developers of low normality. A particular advantage is that a low molecular weight PMGI resin, which is less prone to form scum than a high molecular weight PMGI resin of lower dissolution rate, may be used as the polymer component of a lift off resist. Another advantage is that a more aggressive tetramethyl ammonium hydroxide (TMAH) containing developer, which is compatible with an advanced positive resist of the type frequently used for sub-micron photolithographic processes, may also be used.

Another advantage of the present invention is that the dissolution rate and hence undercut rate of an LOR layer can be increased or decreased while maintaining a relatively high value of the actinic absorbance required for the effective suppression of standing waves. Still another advantage is that a more aggressive TMAH-containing developer, which is compatible with advanced positive resists of the i-line type frequently used for sub-micron photolithographic processes may be used.

Still another aspect of the present invention is that the resin/dissolution rate modifier composition described above may also be used as non-lift-off, anti-reflective coating in applications to manufacture semi-conductor devices.

DETAILED DESCRIPTION OF THE INVENTION

According to the present invention, the actinic absorbance of an LOR layer, which is conveniently defined by the imaginary part of the refractive index k at a specified wavelength (also referred to as the absorption or extinction of the material), can be increased or decreased, and concurrently the dissolution rate and hence undercut rate of an LOR layer increased or decreased, by forming the layer from mixtures of a polyglutarimide resin and one or more particular non-subliming, non-volatilizing bis-azo dyes. Such dyes act as a dissolution rate enhancer or inhibitor in the presence of a base, and have a low propensity to produce scum when removed from an LOR layer during development. Specifically, the above-noted actinic dyes of formulae (IA) and (IB) can be tailored to be either dissolution rate enhancers or inhibitors by adjusting the number of free hydroxyls and capped hydroxyls in these dyes. Dyes having more free hydroxyls tend to be dissolution rate accelerators; dyes having more capped hydroxyl groups (i.e. most of $R_1$, $R_2$, $R_3$, and $R_4$ are groups other than hydroxyl groups) tend to be dissolution rate inhibitors.

These actinic dyes could be incorporated into a LOR in several different ways, including, for example, the following:

(a) a single actinic dye having only free hydroxy groups and no capped hydroxyl groups could be used as a dissolution rate accelerator;

(b) a plurality of actinic dyes, each having only free hydroxyl groups and no capped hydroxyl groups, could be used as a dissolution rate accelerator;

(c) a single actinic dye having both free hydroxyl groups and capped hydroxyl groups could be used as either a dissolution rate accelerator or inhibitor, depending upon the type, position and number of each class of hydroxyl group;

(d) a plurality of actinic dyes, wherein each dye contains both free hydroxyl groups and capped hydroxyl groups, could be used as either a dissolution rate accelerator or inhibitor, depending upon the position and number of each class of hydroxyl group.

(e) a plurality of actinic dyes, wherein one of more of the dyes have only free hydroxyl groups and wherein one or more of the other dyes have only capped hydroxyl groups, could be used as either dissolution rate accelerators or inhibitors, depending upon the type, position and number of each class of hydroxyl group;

(f) a plurality of actinic dyes, wherein one or more of the dyes have only free hydroxyl groups and wherein one or more of the other dyes have both free hydroxyl groups and capped hydroxyl groups in their molecules, could be used as either dissolution rate accelerators or inhibitors, depending on the particular dyes used and the type, position and number of each class of hydroxyl groups on each dye;

(g) a plurality of actinic dyes, wherein one of more of the dyes have only capped hydroxyl groups and wherein one or more of the other dyes have both hydroxyl groups and capped hydroxyl groups in their molecules, could be used as either dissolution rate accelerators or inhibitors, depending on the particular dyes used and the type, position and number of each class of hydroxyl group used in each dye;

(h) a single actinic dye having only capped hydroxyl groups and no free hydroxyl groups, could be used as a dissolution rate inhibitor; and (i) a plurality of actinic dyes, each having only capped hydroxyl groups and no free hydroxyl groups, could be used as a dissolution rate inhibitor.

Preferred bis-azo dyes of the present invention possess two azobenzene chromophores, imparting a relatively high extinction coefficient at an actinic wavelength corresponding to the peaks in the near UV spectrum of a mercury or mercury-xenon arc lamp, such as 365, 408 or 436 nm, or the 248 nm wavelength of an eximer laser, are represented by Formulae (IA) and (IB) in which each $R_1$ and $R_2$ is preferably selected from hydrogen, unsubstituted or substituted lower alkyl, alkoxy, or hydroxy or a combination thereof, X is an aromatic group and $R_3$ and $R_4$ are hydrogen, alkyl or arylsulfonyl; each m is an integer from 1 to 5 and n is an integer from 1 to 4.

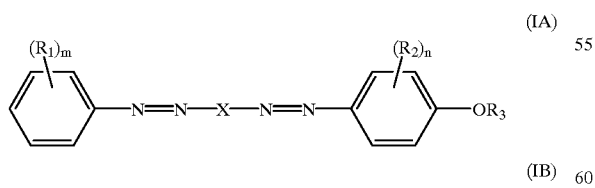

(IA)

(IB)

Preferred examples of X are shown in Formulae (A–I).

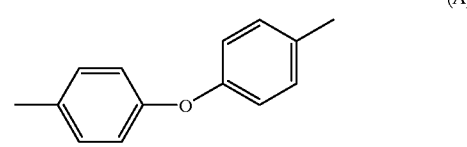

(A)

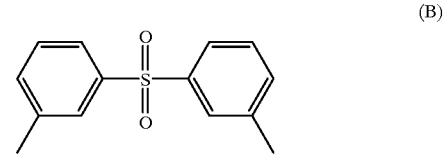

(B)

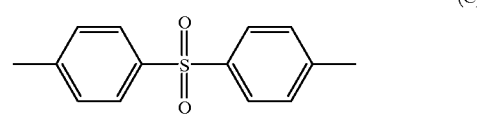

(C)

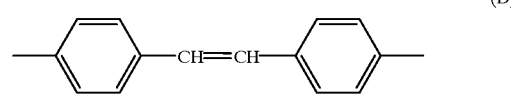

(D)

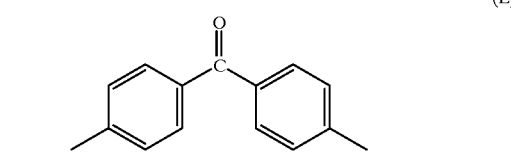

(E)

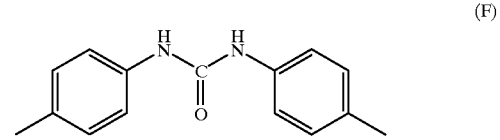

(F)

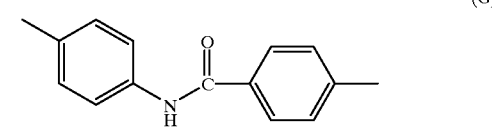

(G)

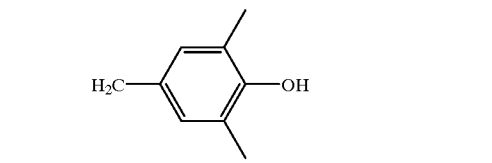

(H)

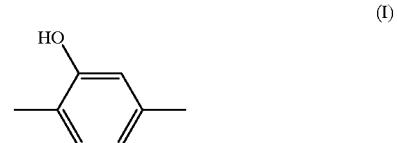

(I)

Preferred examples of $R_3$ and $R_4$ of Formulae (IA) and (IB) are hydrogen, methyl, ethyl or the arylsulfonyl groups. The preferred arylsulfonyl groups are p-toluene sulfonyl, xylenesulfonyl, 1-naphthalenesulfonyl or 2-naphthalenesulfonyl as shown in Formulae (J–M) respectively:

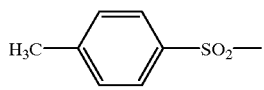 (J)

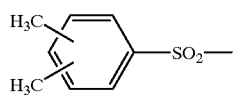 (K)

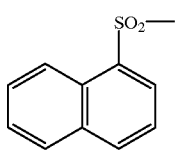 (L)

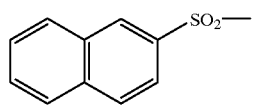 (M)

Preferred bis-azodyes of the present invention are bis-arylazo dyes of Formula (IIA) and (IIB) as shown below, or the mono esters if formulae (IIC) or (IID) or diarylsulfonate esters of Formulae (IIB) and (IIC) or the diester of formula (IIE) or mixtures thereof, especially where R of Formulae (IIC–IIE) is an arylsulfonyl group. Preferred examples of R of Formulae (IIC–IIE) are p-toluenesulfonyl, xylenesulfonyl, 1-naphthalenesulfonyl or 2-naphthalene sulfonyl as shown in Formulae (J–M) above.

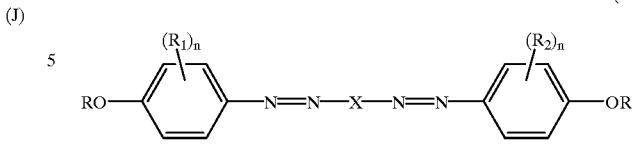

(IIA)

(IIB)

(IIC)

(IID)

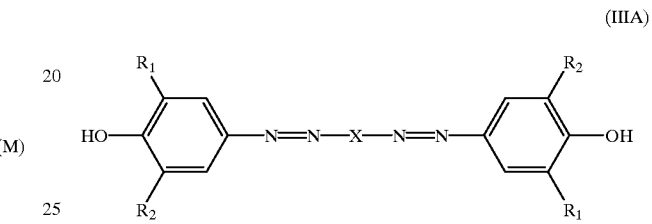

(IIE)

More preferred bis-azo dyes are of the type shown in Formulae (IIIA–IIIC) in which $R_2$ and $R_3$ are independently selected from hydrogen or lower alkyl and X is a substituted benzene or bridged diphenyl group.

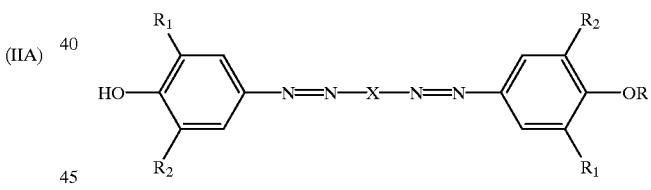

(IIIA)

Preferred bis-azo dyes of Formulae (IIIB) and (IIIC) are the mono- and disubstituted arylsulfonyl esters of the bis-(hydroxyarylazo) dyes of Formula (IIIA), in which R is an aryl sulfonyl group and is preferably p-toluenesulfonyl, xylenesulfonyl, 1-naphthalenesulfonyl or 2-naphthalenesulfonyl shown in Formulae (J–M) above.

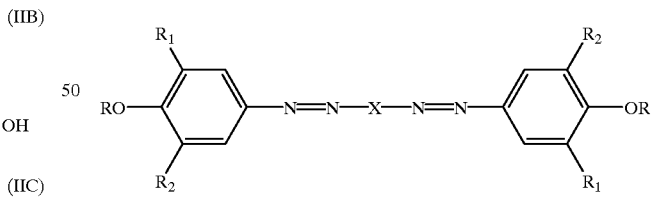

(IIIB)

(IIIC)

A preferred example of an actinic absorbing dye which is a dissolution rate accelerator is oxybis(phenol), 4,4'-{oxybis (4,1-phenyleneazo)}diphenol, of Formula (IV), which is non-subliming and has relatively strong absorption at 365 nm. This dye behaves as a dissolution rate accelerator due to the presence of two phenoxy groups attached to the bis-azo chromophore. Another preferred example is sulfonylbis (hydroxyazobenzene) of Formula (V).

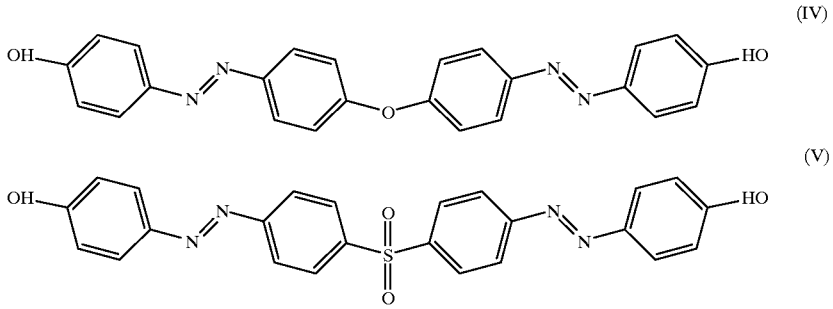

(IV)

(V)

The contribution of selected bis-azobenzene dyes to the increase in the dissolution rate of an LOR formulation, can be reduced by introducing lower alkyl groups at the positions ortho to the phenyl hydroxy groups. A preferred example is oxybis(2,6-dimethylhydroxyazobenzene) of Formula (VI):

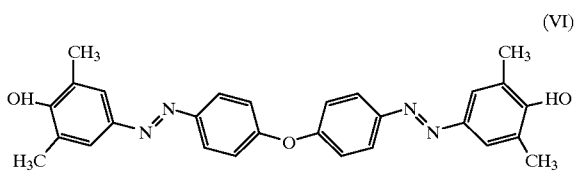

(VI)

A preferred example of an actinic absorbing bis-azo dye having an alkoxy group in the para position and a hydroxy group attached to central the aromatic ring is 2-(2,3-dimethylphenylazo)-4-(4-methoxyphenyl)phenol, and is shown in Formula (VII) below:

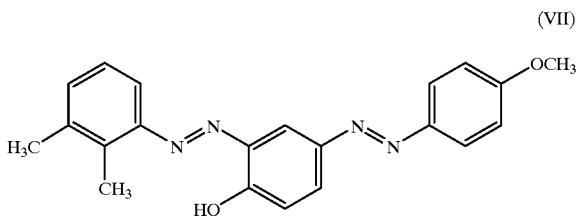

(VII)

The dyes of Formulae (IV), (V), (VI) and (VII) are referred to as D1, D2, D3, and D4 respectively in the Examples given below.

A further reduction in the contribution to the dissolution rate, and hence the degree of undercut, of an LOR resist layer comprising polyglutarimide resin and a bis-azobenzene dye of Formula (IIA) or (IIB) described above, can be obtained by esterification of one or more of the hydroxy groups on the phenolic rings with an aromatic sulfonylchloride to form a monoester or diester. The most preferred aromatic sulfonyl chloride is p-toluenesulfonyl chloride.

In order to precisely control the dissolution rate and achieve a high concentration of the absorbing chromophore of the dye in the LOR composition without intermixing or scum, it is desirable to use a mixture of the unesterified dye with either the mono or diester or both. This can be conveniently achieved by carrying out the esterification with a mole ratio of the aromatic sulfonylchloride to the bis-azo dye of Formula (IIA) of less than 1:1, and with dye of Formula (IIB) of less than 2:1 and more preferably about 1:1. In the case of a dye of Formula (IIA), this results in a mixture of the unesterified dye and the aromatic sulfonate monoester of Formula (IIC). In the case of a dye of Formula (IIB), this results in a mixture of the unesterified dye and the aromatic sulfonate monoester of Formula (IID), and depending on the degree of esterification the diester of Formula (IIE) may be present in the mixture.

In like manner, a preferred level of esterification is achieved with a mole ratio of the aromatic sulfonylchloride to the bis-azo dye of Formula (IIIA) of less than 2:1, and more preferably about 1:1. This results in a mixture of the unesterified dye and the aromatic sulfonate monoester of Formula (IIIB),and depending on the degree of esterification the diester of Formula (IIIC) may be present in the mixture.

A mixture of the aromatic sulfonate diester of the dye, the non-esterified dye, and the aromatic sulfonate monoester of the dye, is preferably blended with a low molecular weight PMGI resin to produce formulations having desired dissolution rates and high absorbance at an actinic wavelength. The percentage by weight of the total solids, of the mixture of dye components, which is useful to increase the absorbance and modify the dissolution rate, is about 6–60% and preferably about 8–40%.

It is practically useful to combine the non-esterified dye, and the diester if needed, with the reaction product obtained from an esterification reaction in which the mole ratio of the aromatic sulfonyl chloride to the dye is less than 2:1 and preferably about 1:1. Using this combination, the dissolution rate is easily adjusted to be higher or lower than the resin alone, and the absorbance k can be maintained fairly constant.

Preferred esters, and mixtures of esters with the dye are aromatic sulfonyl esters of dyes of Formulae (IIA) and (IIB). More preferred are p-toluenesulfonate mono- and diesters of dyes of Formula (IIIA). Most preferred are the mono- and di-p-toluenesulfonate esters of dyes D1 and D2.

Combinations of dyes of the present invention and any another selected compound which can act as a dissolution inhibitor in a polyglutarimide resin may also be used to further increase or reduce the dissolution rate and increase the film absorbance at selected wavelengths.

Suitable aromatic sulfonyl chlorides are those in which the aromatic moiety is a substituted or unsubstituted benzene or naphthalene. The preferred aromatic moieties are toluene, xylene and naphthalene. Most preferred is p-toluenesulfonyl chloride.

Suitable polyglutarimide resins are polydimethylglutarimides (PMGI) pre-formed polymers supplied commercially by Rohm and Haas for use in photoresists, containing about 60–80 mole % of imide moieties, and having a ratio of N–H vs N-methyl of about 5:5 to 7:3, and a glass transition temperature of about 185–195° C. The weight average molecular weight of the standard PMGI resin is typically in the range from about 70,000 to about 110,000, and can be reduced by pre-exposing the solid resin to electron beam radiation of about 30–70 MRads. The reduction in molecular weight depends on the total amount of energy absorbed by the resin. The preferred molecular weights are selected on the basis of the dissolution rate of the resin in a standard developer. For the standard high molecular weight resin the preferred molecular weight range is about 70,000 to about 90,000. For the pre-exposed low molecular weight resin the preferred molecular weight range is below about 30,000.

Suitable solvents useful for dissolving polyglutarimides such as PMGI, and the esterified or unesterified poly hydroxyphenolic compounds of the present invention include polar amide solvents such as dimethylformamide and N-methyl pyrollidone, ketonic solvents such as cyclopentanone, 2-pentanone and 2,4-pentanedione, cyclic ethers such as 1,3-dioxolane and tetrahydofuran, cyclic keto-ethers such as gamma-butyrolactone, hydroxylic polar solvents such as tetrahydrofurfuryl alcohol; and mixtures of the above.

Any one or more of the above solvents may be combined with solvents which alone may not dissolve PMGI such as ethyl lactate, propylene glycol monomethyl ether, propylene glycol methyl ether acetate, methylamyl ketone, cyclohexanone, methyl methoxypropionate, ethyl ethoxypropionate and the like.

Preferred solvent systems are those which give uniform striation-free, pinhole free coatings, and are either cyclopentanone or mixtures of cyclopentanone with propylene glycol monomethyl ether or tetrahydrofurfuryl alcohol, in which the cyclopentanone comprises more than 70% by weight of the mixed solvents.

Selected dyes may be added to mixtures of the polyhydroxycompounds either singly or in combination with aromatic sulfonyl chloride esters of the present invention to modify the absorbance characteristics at a desired wavelength.

Other additives, well known to those skilled in the art, which may be optionally used to improve the coating quality of a spin-coating resist formulation include leveling agents, wetting agents and adhesion promoters. Such additives include for example, surfactants for improving the coatability and reducing the tendency for striations to form in the coated film. Such surfactants include polyoxyethylene nonylphenol ether, polyethylene glycol dilaurate and the like. Also there may be used fluorine containing surfactants such as Megafac F171 and F173 (trade names of Dainippon Ink & Chemicals Inc.), Fluorad FC430 and FC431 (trade names of 3M Corp. Inc.), and Troysol MS-2 (trade name of Troy Corp.). The amount of surface active agent used is preferably 0.05 to 0.25% of the total solids.

The LOR solution is formed by dissolving the polyglutarimide resin, dissolution rate modifying dye and other additives if used in the selected coating solvent system. The term "effective amount" as applied to the amount of the dissolution rate modifier or modifiers in the LOR compositions of the present invention may be any amount that produces a desirable change in the dissolution of the LOR without adversely effecting the other properties of the LOR. The resin is typically dissolved in the solvent system to a concentration of about 5 to 15 weight percent. The dissolution rate modifying dye is typically present in an amount of about 5 to 50% of the total solids present in the solution. The solution is filtered through a polypropylene or Teflon filter to remove particulate matter. The LOR layer is formed by spin-coating the LOR solution onto a substrate to form a uniform layer of thickness of about 0.05 to about 1 micron, preferably, from about 0.05 to about 0.2 microns. The substrate materials are are typically gallium arsenide, silicon, or ceramic which may have deposited on their surface other materials such as an oxide (e.g. silicon oxide), a nitride (e.g. silicon nitride), a metal or an alloy (e.g. nickel-ion or iron-ion metals or alloys). The most preferred substrate is ceramic such as alumina having a nickel-ion metal layer deposited thereon. The LOR layer is soft-baked by heating on a hot-plate or in a convection oven to a temperature of 140–200° C. and preferable from 150–170° C.

The imaging photoresist layer is deposited on top of the LOR layer to a uniform thickness of about 0.5 to about 2.0 microns. The imaging photoresist is usually a commercial positive resist of the type commonly used in the manufacture of semiconductor devices, either of the novolak-diazonaphthoquinone or chemically amplified type. The top imaging photoresist layer must not intermix with the imaging resist layer.

The photoresist layer is exposed through a photomask containing the pattern to be transferred. The resist layer is soft-baked by heating to a temperature of 90–130° C. to remove most of the residual solvent. The pattern is transferred from a mask to the resist film using a conventional microlithographic imaging tool such as a contact-proximity printer or a stepper.

The exposing radiation is in the wavelength range 200–450 nm and may comprise a broad band or a narrow band, depending on the type of imaging tool required to a transfer an image of the pattern on the photomask at the desired resolution. Narrow wavelength bands corresponding to the spectral output of a mercury or mercury-xenon lamp or an eximer laser. Preferred narrow bands are at 408, 435, 365, or 248 nm.

Suitable developers are commercially available alkaline aqueous developers such as tetramethyl ammonium hydroxide, and metal ion-containing such as sodium hydroxide, potassium hydroxide, potassium carbonate and the like. A preferred developer composition contains 2.38% tetramethyl ammonium hydroxide in DI water to which a surfactant may be added. Preferred commercial developers are Shipley LDD26W developer and AZ 400 developer diluted 1:1 by volume with deionized water.

The present invention is further described in detail by means of the following Examples and Comparisons. All parts and percentages are by weight and all temperatures are degrees Celsius unless explicitly stated otherwise.

EXPERIMENTAL PROCEDURES

Preliminary Determination of the Rate of Undercut and Propensity to Scum

A first non-imaging resist layer of a lift-off resist (LOR) of the present invention was deposited as follows. A uniform coating of the solution to be tested, of approximately 1000 Angstroms in thickness was deposited onto a silicon wafer by spin coating at a final speed of 3000 rpm for 30 seconds. The coated wafer was soft-baked on a hot plate at either 165° C. or 175° C. for 3 minutes. The film thickness was determined using a Nanospec thin film reflective interferrometric microscope.

A second photoresist layer (imaging layer) was deposited as follows. A uniform coating of approximately 1.2 micron thickness of Shipley S1818 positive resist, or 0.6 micron of Sumitomo PFI81 A7 positive resist was deposited by spin-coating on top of the of the first layer. The coated wafer was soft-baked on a hotplate at 115° C. for 1 minute. The coating was examined for the presence intermixing which results in an interference pattern, having the appearance of circular bands radiating from the center of the substrate, which is easily observed by viewing the coated substrate in reflection under a narrow band visible light source. The wafer was then placed in proximity to a resolution mask comprising an array of square features having a range of dimensions in the range of 2 to 20 microns, and exposed for a predetermined time to a collimated light beam produced from a Mercury Xenon light source providing uniform radiation in the range of wavelengths 330–450 nm. The exposure time was that required to replicate the dimensions of the mask features in the developed resist film. Following exposure, the wafer was soft-baked on a hotplate at 115° C. for 1 minute.

The rate of undercut in the LOR layer occurring during development of the latent image formed upon exposure of the top photoresist layer was determined as follows. The wafer was placed in a clean petri-dish and 50 ml of either Shipley LDD26W developer (comprising 2.38% of TMAH plus a surfactant in deionized water), or AZ400 proprietary metal ion-containing developer diluted 1:1 with deionized water, was added. The wafer was removed from the developer after about 30 seconds, rinsed with deionized water and blown dry with $N_2$ gas. The wafer was then inspected under a light microscope, and the 20 micron features studied to determine visually if 1 micron of undercut in the lower resist layer had been achieved. If 1 micron had not been achieved, the wafer was placed back into the petri-dish and removed after a further period of time and repeatedly thereafter, at approximately 15 seconds to 5 minute intervals depending upon the dissolution rate, which was typically in the range from 0.03 to 2 microns per minute. The total accumulated development time required to attain 1 micron of undercut was determined. The whole process was repeated without intermittently stopping the development, and the time for 1 micron undercut was determined and compared with the result obtained with intermittent development. If the results were within agreement by 10%, the value reported was that obtained with continual development. If the results differed by more than 10% the process was repeated until two consecutive results agreed within 10%.

Scum was determined to be present in the undercut region if the side-walls of the imaged squares were surrounded by hazy rather than a clear area of undercut or in the case of severe scumming by a mass of particulates.

Experimental Procedure Used to Determine the Imaginary Part of the LOR Film Refractive Index, K.

An LOR composition prepared as described above was spin-coated onto a quartz glass substrate using the same spin-coat conditions as used to coat the LOR layer onto a silicon substrate. The absorbance A ($\lambda$) at a selected actinic wavelength $\lambda$ was measured using a Perkin Elmer Lambda 20 spectrometer with an uncoated borosilicate substrate or quartz substrate placed in the reference beam. The thickness d of the film was assumed to be the same as that determined on a silicon substrate by means of the Nanospec reflective interferometer. The imaginary part of the refractive index, k was calculated using the well-known formula: $k=A'\lambda/4\pi d$, where $A'=2.303A$.

Synthesis Example 1

Oxybis(hydroxyazobenzene), DI of Formula (III) was prepared by coupling oxydianiline with phenol following the well-known diazotization conditions as described, for example in "Chemistry of Azo and Diazo Compounds", S. Patai. The purity was determined by HPLC to be 98% and the extinction coefficient of a solution in THF at the absorption band peak of 365 nm, was 55,000. The melting point was determined to be >200° C.

Synthesis Example 2

Sulfonylbis(hydroxyazobenzene), D2 of Formula (IV) was prepared according to the method of Synthesis Example 1 by coupling sulfonyldianiline with phenol. The purity was determined by HPLC to be >95% and the extinction coefficient of a solution in THF at the absorption band peak of 372 nm, was 57,000. The melting point was determined to be >200° C.

Synthesis Example 3

Oxybis(2,6-dimethylhydroxyazobenzene), D3 of Formula (V) was prepared according to the method of Synthesis Example 1 by coupling oxydianiline with 2,6-dimethylphenol. The purity was determined by HPLC to be 98% and the extinction coefficient of a solution in THF at the absorption band peak of 375 nm, was 55,000. The melting point was determined to be 140° C.

Synthesis Example 4

2-(2'3'-dimethylazo)-4-(4'-methoxyazo)phenol, D4 of Formula (VII) was prepared according to the method of Synthesis Example 1 by coupling 4-hydroxy-4'-methoxyazobenzene with 2,3-dimethylaniline. The purity was determined by HPLC to be 95% And the extinction coefficient of a solution in THF at the absorption band peak of 358 nm was 43,000.

Synthesis Example 5

The p-toluenesulfonate diester of dye D1, was prepared as follows. D1, 4. lgms (0.01 moles), potassium carbonate, 14.2 gms (0.1 moles) was dissolved in 100ml THF and to it was added 4.0 gms (0.02 moles) of p-toluenesulfonyl chloride. The mixture was refluxed for 12 hours, cooled and filtered. The filtrate was precipitated in water, filtered, washed with water and dried in a vacuum oven overnight. The purity was determined by HPLC to be 92% and the extinction coefficient of a solution in THF at the absorption band peak of 360 nm, was 50,000.

Synthesis Example 6

A mixture of p-toluenesulfonate esters of dye D1 was prepared according to the method of Synthesis Example 5 except that the amount of potassium carbonate was 7. lgms (0.05 moles), and the amount of p-toluenesulfonyl chloride was 1.0 gm (0.005 moles), and the reflux time was 5 hours. The composition was determined by HPLC to comprise 35% of the monoester, 10% of the diester and 55% of unreacted D1.

Synthesis Example 7

A mixture of p-toluenesulfonate esters of dye D2 was prepared according to the method of Synthesis Example 5 except that the amount of potassium carbonate was 7.1 gms (0.05 moles) and the amount of p-toluenesulfonyl chloride was 1.0 gm (0.005 moles) and the reflux time was 5 hours. The composition was determined by HPLC to comprise 40% of the monoester, <6% of the diester and 54% of unreacted D2.

Example 1

An LOR composition comprising a mixture of 0.61% by eight of D1 of Synthesis Example 1 present in an amount of 9.1% of the total weight of solids, and 6.0 wt % of PMGI resin having a weight average molecular weight of 15k, and 93.34 wt % of a solvent comprising a mixture of 85% cyclopentanone and 15% of propylene glycol methyl ether, was prepared by rolling on a jar roller for 4 hours followed by filtration through a 0.20 micron Supor filter. The experimental procedure to determine of the rate of undercut and propensity to scum described above was followed. After soft-baking at 175° C. the LOR film thickness was 0.01+/−0.005 microns. Shipley S1818 was used as the positive photoresist, which showed no intermixing with the LOR layer. After subsequent exposure and development in Shipley LDD26W developer, the time for 1 micron of undercut was determined to be 45 seconds and the undercut regions showed no evidence of scum. The absorbance of a 0.1 micron thick film was measured in accordance with the procedure described above, from which the value of k at 365 nm was determined to be 0.06.

Example 2

The method according to Example 1 was repeated except that the dye was D3 of synthesis Example 3. The photoresist showed no intermixing with the LOR layer. After subsequent exposure, the development time for 1 micron of undercut was determined to be 1.5 minutes and the undercut regions showed no evidence of scum. The value of k at 365 nm was determined to be 0.05.

Comparative Example 1

The method according to Example 1 was repeated except that no dye was present. The photoresist showed no intermixing with the LOR layer. After subsequent exposure, the development time for 1 micron of undercut was determined to be 2.5 minutes. The value of k at 365 nm was determined to be less than 0.01.

Example 3

The method according to Example 1 was repeated except that the dye was D2 of synthesis Example 2, and the PMGI resin had a weight average molecular weight of 80,000. The photoresist showed no intermixing with the LOR layer. After subsequent exposure, the development time for 1 micron of undercut was determined to be 4 minutes and the undercut regions showed no evidence of scum. The value of k at 365 nm was determined to be 0.06.

Example 4

The method according to Example 3 was repeated except that the dye D1 was present in an amount of 0.29 wt % and the PMGI resin was present in an amount of 3.1 wt % and the solvent was present in an amount of 96.88% and the thickness of the film was 0.05 um. The photoresist showed no intermixing with the LOR layer. After subsequent exposure, the development time for 1 micron of undercut was determined to be 4.3 minutes and the undercut regions showed no evidence of scum. The value of k at 365 nm was determined to be 0.06.

Example 5

The method according to Example 3 was repeated except that the dye D4 of Synthesis Example 4 and the LOR was soft baked at a temperature of 165° C. and the positive photoresist was Sumitomo PFI 81 A7. The photoresist showed no intermixing with the LOR layer. After subsequent exposure, the development time for 1 micron of undercut was determined to be 4.3 minutes and the undercut regions showed no evidence of scum. The value of k at 365 nm was determined to be 0.06.

Comparative Example 2

The method according to Example 3 was repeated except that no dye was present. The photoresist showed no intermixing with the LOR layer. After subsequent exposure, the development time for 1 micron of undercut was determined to be 16 minutes. The value of k at 365 nm was determined to be less than 0.01.

The results of Examples 1–5 and Comparative Examples 1 and 2 show that in each case, a dye of the present invention can be added to a solvent and a PMGI resin of either a high or low molecular weight to form an LOR, in an amount which does not lead to any intermixing with the photoresist layer, said amount being sufficient produce a significant increase in the LOR layer absorbance at the actinic wavelength of 365 nm, and a concurrent increase in the value of the undercut rate compared with an LOR comprising a PMGI resin alone, producing an undercut region which is free from scum.

Example 6

The method according to Example 1 was repeated except that the dye was the p-toluensulfonate diester of dye D1, prepared according to Synthesis Example 5, and was present in an amount of 0.51 wt % being 7.7% of the total solids, and the PMGI resin was present in a amount of 6. 1 wt %, and the solvent was present in an amount of 93.39 wt %. The photoresist showed no intermixing with the LOR layer. After subsequent exposure, the development time for 1 micron of undercut was determined to be 30 minutes and the undercut regions showed no evidence of scum. The value of k at 365 nm was determined to be 0.05.

Example 7

The method according to Example 1 was repeated except that the dye was the reaction product of Synthesis Example 6 comprising a mixture of the p-toluenesulfonate diester, the monoester and the unesterified dye D1 of synthesis Example 1. The photoresist showed no intermixing with the LOR layer. After subsequent exposure, the development time for 1 micron of undercut was determined to be 14 minutes and the undercut regions showed no evidence of scum. The value of k at 365 nm was determined to be 0.07.

Example 8

The method according to Example 1 was repeated except that the dye was the reaction product of Synthesis Example 7 comprising a mixture of the p-toluenesulfonate diester, the monoester and the unesterified dye D2 of Synthesis Example 2, and the LOR was soft-baked at a temperature of 165° C. and the positive photoresist was Sumitomo PFI 81 A7. The photoresist showed no intermixing with the LOR layer. After subsequent exposure, the development time for 1 micron of undercut was determined to be 6 minutes and the undercut regions showed no evidence of scum. The value of k at 365 nm was determined to be 0.07.

Example 9

The method according to Example 1 was repeated except that the dye was a mixture of 40 wt % of dye D1 of Synthesis Example 1 and 30 wt % of the p-toluenesulfonate diester of dye D1 prepared according to Synthesis Example 5, and 30 wt % of the reaction product of Synthesis Example 6, said mixture being present in an amount of 2.58 wt % being 26.9% of the total solids, and the PMGI resin was present in a amount of 7.0 wt %, and the solvent was present in an amount of 90.42 wt %. The photoresist showed no intermixing with the LOR layer. After subsequent exposure, the development time for one micron of undercut was determined to be 8 minutes, the undercut regions showed no evidence of scum. The value of k at 365 nm was determined to be 0.20.

Example 10

The method according to Example 1 was repeated except that the dye was a mixture of 50 wt % of dye D1 of Synthesis Example 1 and 25 wt % of the p-toluenesulfonate diester of dye D1 prepared according to Synthesis Example 5, and 25 wt % of the reaction product of Synthesis Example 6, said mixture being present in an amount of 3.08 wt % being 30.5% of the total weight of solids, and the PMGI resin was present in a amount of 7.01 wt %, and the solvent was present in an amount of 89.92 wt %. The photoresist showed no intermixing with the LOR layer. After subsequent exposure, the development time for one micron of undercut was determined to be 6 minutes, and the undercut regions showed no evidence of scum. The value of k at 365 nm was determined to be 0.24.

Example 11

The method according to Example 10 was repeated except that the LOR was soft baked at a temperature of 165° C. and the positive photoresist was Sumitomo PFI 81 A7. The photoresist showed no intermixing with the LOR layer. After subsequent exposure, the development time for 1 micron of undercut was determined to be 5 minutes and the undercut regions showed no evidence of scum. The value of k at 365 nm was determined to be 0.24.

The results of Examples 6–11 and Comparative Example 1 show that in each case, the p-toluensulfonate mono- or diesters of a dye of the present invention retain the absorption characteristics of the parent dye and are completely miscible with a polyglutarimide polymer; and either individually or as a mixture with the non-esterified dye, can be added to a solvent and a low molecular weight PMGI resin to form an LOR, in an amount which does not lead to any intermixing with the photoresist layer, said amount being sufficient to produce a significant increase in the LOR layer absorbance at the actinic wavelength of 365 nm, and a decrease in the value of the undercut rate compared with an LOR comprising low molecular weight PMGI alone, producing an undercut region which is free from scum. Furthermore, the amount by which the undercut rate can be decreased is easily adjusted by changing the ratio of the amounts of the esterified and non-esterified dye components in the LOR while maintaining a high value of the actinic absorbance k.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. The present invention is directed to compositions useful for a lift-off resist in a bilayer metal lift-off process, which comprise a mixture of at least one solvent, at least one polyglutarimide resin and an effective amount of at least one actinic-absorbing dissolution rate modifier of the formula (IA or (IB):

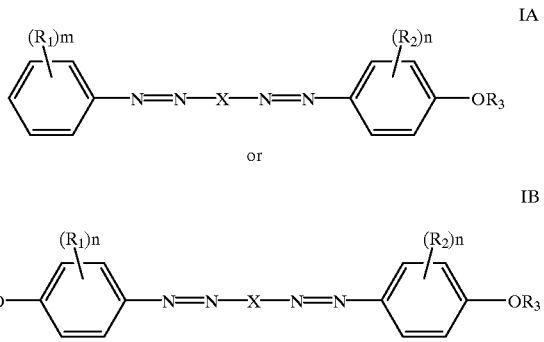

in which each $R_1$ and $R_2$ is selected from the group consisting of hydrogen, unsubstituted or substituted alkyl, alkoxy, nitro, halo, amide or hydroxy or a combination thereof, X is an aromatic group and each $R_3$ and $R_4$ are individually selected from the group consisting of hydrogen, an unsubstituted or substituted alkyl or arylsulfonyl; each m is an integer from 1 to 5 and each n is an integer from 1 to 4.

2. The composition of claim 1 wherein X in formulae (IA) or (IB) has a structure of formulae A–I:

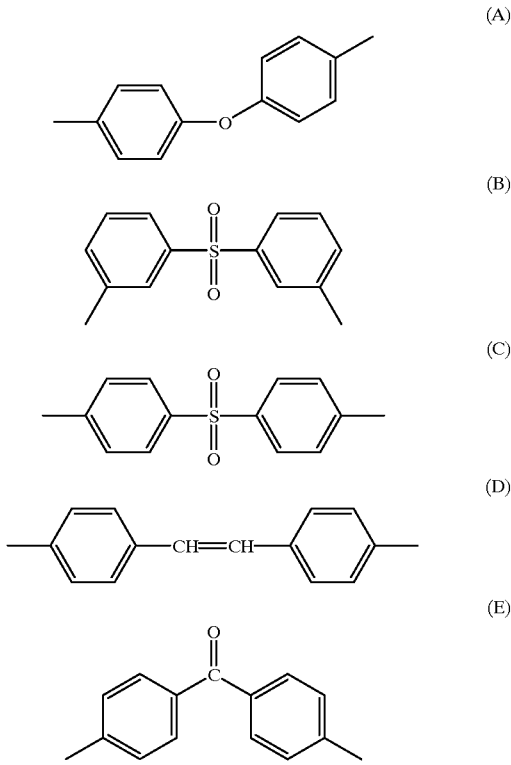

(F)

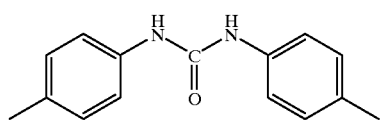

(G)

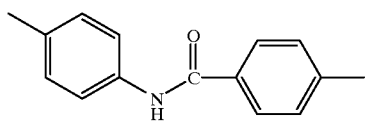

(H)

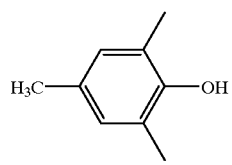

(I)

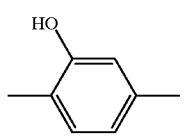

3. The composition of claim 1 wherein each $R_3$ and $R_4$ in formulae (IA) and (IB) are selected from the group consisting of hydrogen, methyl, ethyl, p-toluene sulfonyl, xylenesulfunyl, 1-naphthalsulfonyl and 2-anphthalesesulfonyl.

4. The composition of claim 1 wherein the actinic-absorbing dissolution rate modifiers are selected from structures of formula (IIA), (IIB), (IIC), (IID), and (IIE):

(IIA)

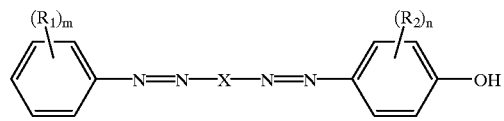

(IIB)

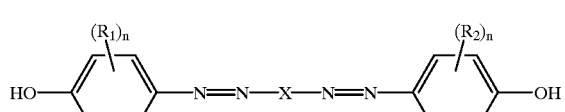

(IIC)

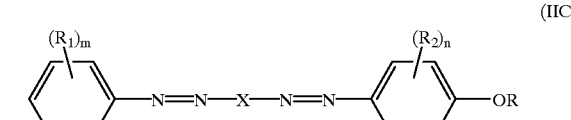

(IID)

(IIE)

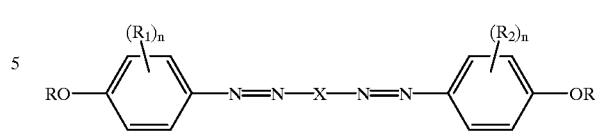

Wherein $R_1$, $R_2$ m and n are as defined above and R is selected from the group consisting of p-toluenesulfonyl, xylenesulfonyl, 1-naphthalenesulfonyl and 2-naphthalenesulfonyl.

5. The composition of claim 1 wherein the actinic-absorbing dissolution rate modifiers are selected from structures having the formulae (IIIA); (IIIB) and (IIIC):

(IIIA)

(IIIB)

(IIIC)

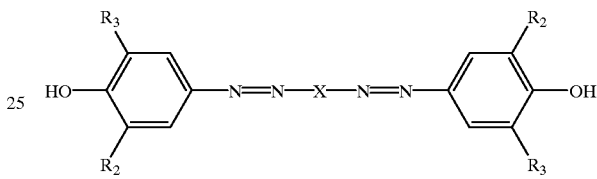

wherein $R_1$ and $R_2$ are the same as defined in claim 1 and R is selected from the group consisting of p-toluenesulfonyl, xylenesulfonyl, 1-naphthalenesulfonyl, and 2-naphthalenesulfonyl.

6. The composition of claim 1 wherein the dissolution rate modifier is oxybis (phenol), 4, 4'-oxybis(4,1-phenyleneaze) diphenol having a structure of formulae (IV):

(IV)

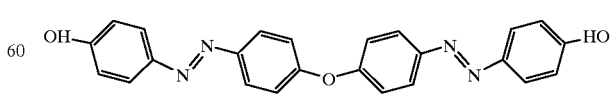

7. The composition of claim 1 wherein the dissolution rate modifier is sulfonylbis(hydroxyazobenzene) having a structure of formula (V):

(V)

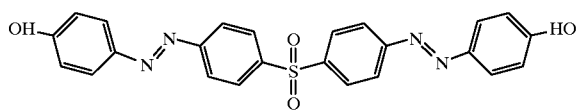

8. The composition of claim 1 wherein the dissolution rate modifier is oxybis(2,6-dimethylhydroxyazobenzene) having a structure of formula (VI):

(VI)

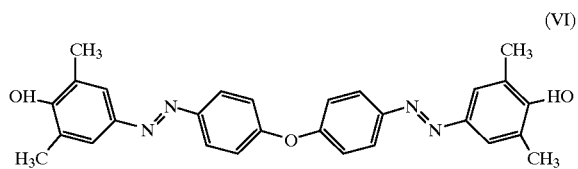

9. The composition of claim 1 wherein the dissolution rate modifier has a structure of formula (VII):

(VII)

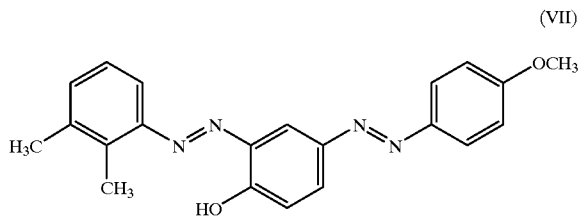

10. The composition of claim 1 wherein the concentration is about 5 to 15 percent of the solvent.

11. The composition of claim 1 wherein the amount of poly-hydroxy aromatic compound is from about 5 to about 50 percent by weight of the polyglutarimide resin.

12. A composite article comprising (1) a microelectronic substrate; (2) a layer of lift-off resist comprising a composition of claim 1 on top of the microelectronic substrates; and (3) a layer of positive-imaging photoresist on top of the layer of lift-off resist.

13. The composite article of claim 11 wherein the substrate is gallium arsenide, silicon or ceramic.

14. The composite article of claim 13 wherein an oxide, a nitride, a metal or an alloy is deposited upon the gallium arsenide, silicon or ceramic.

15. The composite article of claim 14 wherein the substrate is ceramic with a nickel-ion metal deposited thereon.

16. The composite article of claim 12 wherein the positive-imaging photoresist is a novolak-diazonaphthoquinone type.

17. The composite article of claim 12 wherein the layer of lift-off resist has an uniform thickness of about 0.05 to about 1 microns.

18. The composite article of claim 12 wherein the layer of positive-imaging photoresist has an uniform thickness of about 0.5 to about 2.0 microns.

* * * * *